(12) United States Patent
Ueta et al.

(10) Patent No.: US 10,304,777 B2
(45) Date of Patent: May 28, 2019

(54) SEMICONDUCTOR DEVICE HAVING A PLURALITY OF SEMICONDUCTOR MODULES CONNECTED BY A CONNECTION COMPONENT

(71) Applicant: TOYOTA JIDOSHA KABUSHIKI KAISHA, Toyota-shi, Aichi-ken (JP)

(72) Inventors: Takashi Ueta, Toyota (JP); Tomomi Okumura, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/788,148

(22) Filed: Oct. 19, 2017

(65) Prior Publication Data

US 2018/0130748 A1    May 10, 2018

(30) Foreign Application Priority Data

Nov. 9, 2016    (JP) ................................ 2016-218775

(51) Int. Cl.
*H01L 23/00* (2006.01)
*H01L 23/31* (2006.01)
(Continued)

(52) U.S. Cl.
CPC ...... *H01L 23/5386* (2013.01); *H01L 23/3185* (2013.01); *H01L 23/4334* (2013.01);
(Continued)

(58) Field of Classification Search
CPC ............... H01L 25/072; H01L 23/5386; H01L 23/49517; H01L 2924/183; H01L 24/30; H01L 24/83
See application file for complete search history.

(56) References Cited

U.S. PATENT DOCUMENTS 8,878,347 B2 * 11/2014 Kadoguchi ........... H01L 21/565
257/666
9,224,662 B2 * 12/2015 Kadoguchi ........... H01L 23/047
(Continued)

FOREIGN PATENT DOCUMENTS

JP    2012-235081 A    11/2012

*Primary Examiner* — Ngan V Ngo
(74) *Attorney, Agent, or Firm* — Oliff PLC

(57) ABSTRACT

A semiconductor device includes an assembly configured such that a plurality of semiconductor modules is connected by a component. Each of the plurality of semiconductor modules includes a semiconductor element including a front-surface electrode fixing a front-surface electrode plate and a back-surface electrode fixing a back-surface electrode plate, wherein the component is either of a first component and a second component. The first component being configured to connect adjacent semiconductor modules to each other such that a front-surface electrode plate of one of the adjacent semiconductor modules is connected to a back-surface electrode plate of the other one of the adjacent semiconductor modules. The second component is configured to connect adjacent semiconductor modules such that respective front-surface electrode plates are connected and respective back-surface electrode plates are connected. The semiconductor modules are connected by the first component or the second component.

16 Claims, 8 Drawing Sheets

(51) Int. Cl.

| | |
|---|---|
| *H01L 25/07* | (2006.01) |
| *H01L 25/10* | (2006.01) |
| *H01L 25/11* | (2006.01) |
| *H01L 25/18* | (2006.01) |
| *H01L 27/06* | (2006.01) |
| *H01L 23/433* | (2006.01) |
| *H01L 23/492* | (2006.01) |
| *H01L 23/495* | (2006.01) |
| *H01L 23/538* | (2006.01) |
| *H01L 29/739* | (2006.01) |
| *H01L 29/861* | (2006.01) |

(52) U.S. Cl.
CPC ...... *H01L 23/4922* (2013.01); *H01L 23/4952* (2013.01); *H01L 23/49517* (2013.01); *H01L 23/49537* (2013.01); *H01L 23/49541* (2013.01); *H01L 23/49562* (2013.01); *H01L 23/49575* (2013.01); *H01L 24/30* (2013.01); *H01L 24/83* (2013.01); *H01L 25/072* (2013.01); *H01L 25/105* (2013.01); *H01L 25/11* (2013.01); *H01L 25/18* (2013.01); *H01L 23/3107* (2013.01); *H01L 27/0629* (2013.01); *H01L 29/7395* (2013.01); *H01L 29/861* (2013.01); *H01L 2924/183* (2013.01)

(56) References Cited

U.S. PATENT DOCUMENTS

| | | | | |
|---|---|---|---|---|
| 9,312,211 | B2* | 4/2016 | Kadoguchi | H01L 23/051 |
| 9,847,311 | B2* | 12/2017 | Kadoguchi | H01L 23/49562 |
| 9,960,096 | B2* | 5/2018 | Okumura | H01L 25/07 |
| 10,027,250 | B2* | 7/2018 | Nomura | H01L 25/07 |
| 10,103,090 | B2* | 10/2018 | Kadoguchi | H01L 23/4334 |
| 2013/0113090 | A1* | 5/2013 | Atsumi | H01L 24/33 257/676 |
| 2014/0035112 | A1* | 2/2014 | Kadoguchi | H01L 23/49548 257/666 |
| 2014/0197525 | A1* | 7/2014 | Kadoguchi | H01L 21/565 257/666 |
| 2014/0264819 | A1* | 9/2014 | Okumura | H01L 23/3672 257/712 |
| 2015/0287665 | A1* | 10/2015 | Hanada | H01L 25/115 257/691 |
| 2016/0126205 | A1* | 5/2016 | Kadoguchi | H01L 23/49562 257/736 |
| 2016/0247743 | A1* | 8/2016 | Kadoguchi | H01L 23/293 |
| 2016/0315037 | A1* | 10/2016 | Kadoguchi | H01L 23/49562 |
| 2016/0336251 | A1* | 11/2016 | Fukuoka | H01L 29/7395 |
| 2017/0141068 | A1* | 5/2017 | Kadoguchi | H01L 24/27 |
| 2017/0278774 | A1* | 9/2017 | Hayashi | H01L 21/4825 |
| 2017/0338190 | A1* | 11/2017 | Fujino | H01L 23/051 |
| 2018/0012847 | A1* | 1/2018 | Onoda | H01L 23/40 |
| 2018/0026021 | A1* | 1/2018 | Morino | H01L 23/29 257/717 |
| 2018/0211938 | A1* | 7/2018 | Tsuyuno | H01L 25/18 |

* cited by examiner

SEMICONDUCTOR DEVICE HAVING A PLURALITY OF SEMICONDUCTOR MODULES CONNECTED BY A CONNECTION COMPONENT

INCORPORATION BY REFERENCE

The disclosure of Japanese Patent Application No. 2016-218775 filed on Nov. 9, 2016 including the specification, drawings and abstract is incorporated herein by reference in its entirety.

BACKGROUND

1. Technical Field

The present specification discloses a semiconductor device in which a plurality of semiconductor elements is sealed in a molding resin in an integrated manner.

2. Description of Related Art

Japanese Patent Application Publication No. 2012-235081 (JP 2012-235081 A) discloses semiconductor devices in which two semiconductor elements are sealed in a molding resin in an integrated manner, i.e., a semiconductor device in which two semiconductor elements are connected in series in a molding resin, and a semiconductor device in which two semiconductor elements are connected in parallel in a molding resin.

In the technique of JP 2012-235081 A, at the time when two semiconductor elements are placed adjacent to each other, a back-surface electrode plate that makes contact with back-surface electrodes of the semiconductor elements, and a front-surface electrode plate that makes contact with front-surface electrodes of the semiconductor elements are used. In a case where a semiconductor device in which two semiconductor elements are connected in parallel is manufactured, an assembly in which respective back-surface electrodes are connected to each other via the back-surface electrode plate and respective front-surface electrodes are connected to each other via the front-surface electrode plate is packaged with a molding resin. In a case where a semiconductor device in which two semiconductor elements are connected in series, the front-surface electrode plate and the back-surface electrode plate of the assembly in the above state are partially cut and deformed in such a shape that the front-surface electrode plate of one of the semiconductor elements makes contact with the back-surface electrode plate of the other one of the semiconductor elements, and the assembly thus deformed is packaged with a molding resin.

SUMMARY

In the technique of JP 2012-235081 A, in a case of manufacturing a semiconductor device providing a series circuit, an assembly to be subjected to a resin molding step is obtained through a step of assembling an assembly in which two semiconductor elements are fixed to a back-surface electrode plate and the two semiconductor elements are fixed to a front-surface electrode plate, and a step of cutting and deforming the electrode plates. The assembling step and the cutting and deforming step require different facilities, which leaves a problem for productivity. The present specification discloses a technique that does not require a cutting and deforming step at the time of assembling.

A semiconductor device according to a first aspect of the disclosure includes: an assembly configured such that a plurality of semiconductor modules is connected by a connection component, the assembly being sealed with a molding resin, wherein: each of the plurality of semiconductor modules includes a semiconductor element including a front-surface electrode and a back-surface electrode, a front-surface electrode plate fixed to the front-surface electrode, and a back-surface electrode plate fixed to the back-surface electrode; the connection component is either of a first connection component and a second connection component, the first connection component being configured to connect adjacent semiconductor modules to each other such that a front-surface electrode plate of one of the adjacent semiconductor modules is connected to a back-surface electrode plate of the other one of the adjacent semiconductor modules, the second connection component being configured to connect adjacent semiconductor modules to each other such that respective front-surface electrode plates are connected to each other and respective back-surface electrode plates are connected to each other; and the adjacent semiconductor modules are configured to be connected to each other by the first connection component or the second connection component.

A semiconductor device according to a second aspect of the disclosure includes: a first semiconductor module including a first semiconductor element including a first front-surface electrode and a first back-surface electrode, a first front-surface electrode plate fixed to the first front-surface electrode, and a first back-surface electrode plate fixed to the first back-surface electrode; a second semiconductor module including a second semiconductor element including a second front-surface electrode and a second back-surface electrode, a second front-surface electrode plate fixed to the second front-surface electrode, and a second back-surface electrode plate fixed to the second back-surface electrode; a connection component configured to connect the first front-surface electrode plate to the second back-surface electrode plate; and a molding resin configured to seal the first semiconductor module, the second semiconductor module, and the connection component.

In the second aspect, the first front-surface electrode, the second back-surface electrode, and the connection component may be partially exposed from the molding resin.

A semiconductor device according to a third aspect of the disclosure includes: a first semiconductor module including a first semiconductor element including a first front-surface electrode and a first back-surface electrode, a first front-surface electrode plate fixed to the first front-surface electrode, and a first back-surface electrode plate fixed to the first back-surface electrode; a second semiconductor module including a second semiconductor element including a second front-surface electrode and a second back-surface electrode, a second front-surface electrode plate fixed to the second front-surface electrode, and a second back-surface electrode plate fixed to the second back-surface electrode; a first connection component configured to connect the first front-surface electrode plate to the second front-surface electrode plate; a second connection component configured to connect the first back-surface electrode plate to the second back-surface electrode plate; and a molding resin configured to seal the first semiconductor module, the second semiconductor module, the first connection component, and the second connection component.

In the third aspect, the first front-surface electrode, the second front-surface electrode, and the first connection component may be partially exposed from the molding resin.

In the third aspect, the first back-surface electrode, the second back-surface electrode, and the second connection component may be partially exposed from the molding resin.

In the third aspect, the first connection component and the second connection component may be integrated with each other by an insulating material.

The above semiconductor device does not require a cutting and deforming step at the time of assembling. By using the connection component to connect the semiconductor modules, it is possible to obtain an assembly to be subjected to a resin molding step. Further, a common semiconductor module can be used for both serial connection and parallel connection. Until the assembling of the semiconductor modules, it is possible to mass produce the semiconductor modules without distinguishing semiconductor modules for parallel connection from semiconductor modules for serial connection.

The technique described in the present specification is useful for a case where two or more semiconductor elements are used, and is not limited to a case where two semiconductor elements are used. The technique is also applicable to a semiconductor device in which three or more semiconductor elements are connected in series, a semiconductor device in which three or more semiconductor elements are connected in parallel, a semiconductor device in which circuits each including two semiconductor elements connected in parallel are connected in series, and the like semiconductor devices.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
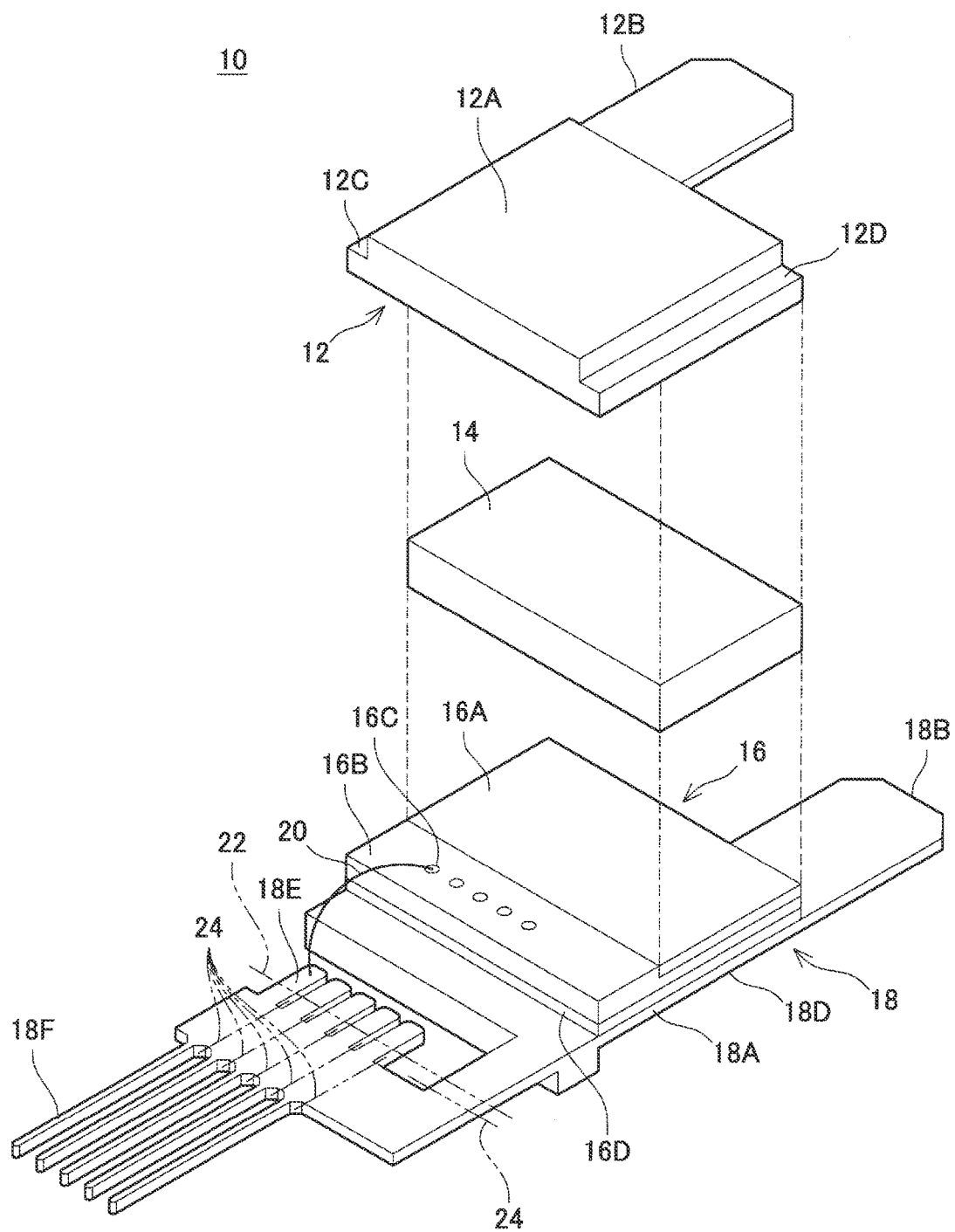
FIG. 1 is a schematic exploded perspective view of a semiconductor module of an embodiment.

As illustrated in FIG. 1, a semiconductor module 10 includes a back-surface electrode plate 18, a semiconductor element 16, a spacer 14, a front-surface electrode plate 12, and so on. The semiconductor element 16 is an IGBT in which a diode is incorporated, and includes a back-surface electrode (in practice, a collector electrode) 16D, and a front-surface electrode (in practice, an emitter electrode) 16A. The back-surface electrode 16D expands over a whole area on a back surface of the semiconductor element 16, whereas the front-surface electrode 16A expands in a partial range on a front surface of the semiconductor element 16, and wire bond pads 16C are provided in a range 16B where the front-surface electrode 16A is not formed. In the figure, a reference numeral is assigned only to one wire bond pad, but a plurality of wire bond pads is provided in practice. The wire bonding pads include a pad connected to a gate electrode of the IGBT, a pad connected to a sensor for outputting a voltage indicative of a temperature of the IGBT, a pad connected to a sensor for outputting a voltage indicative of a conducting current of the IGBT, and the like.

The spacer 14 is constituted by a conductor, and a back surface of the spacer 14 is fixed to the front-surface electrode 16A with solder. A reference numeral 16B indicates a region that is not coated with the spacer 14, and the wire bond pads 16C are formed in a non-coating region 16B.

The front-surface electrode plate 12 is constituted by a conductor, and a back surface of the front-surface electrode plate 12 is fixed to a front surface of the spacer 14. The front-surface electrode plate 12 includes a flat portion 12A fixed to the front surface of the spacer 14, and a terminal portion 12B extending outside the after-mentioned molding resin. In the flat portion 12A, a stepped portion 12C that receives a flat portion 36 of the after-mentioned connection component 30 or a flat portion 46 of the after-mentioned connection component 40, and a stepped portion 12D that receives a flat portion 44 of the after-mentioned connection component 40 are formed.

The back-surface electrode plate 18 is constituted by a conductor, and includes a flat portion 18A fixed to the back-surface electrode 16D of the semiconductor element 16, a terminal portion 18B extending outside the after-mentioned molding resin, a group of bond portions 18E, and a group of pins 18F. The back-surface electrode 16D is fixed, with solder, to a front surface of the flat portion 18A of the back-surface electrode plate 18. In the flat portion 18A, a stepped portion 18D that receives a flat portion 32 of the after-mentioned connection component 30 or a flat portion 50 of the after-mentioned connection component 40, and a stepped portion 18C (not illustrated in FIG. 1) that receives a flat portion 52 of the after-mentioned connection component 40 are formed. In the figure, a reference numeral 18E is assigned only to one of the bond portions, and a reference numeral 18F is assigned only to one of the pins, but a plurality of bond portions and a plurality of pins are provided in practice. The pins 18F are formed into a linear shape so as to pass through respective bond portions 18E. Note that the pins 18F and the bond portions 18E may be in a positional relationship in which they are moved in parallel to each other only by a predetermined distance. In FIG. 1, only one bonding wire 20 is illustrated, but in practice, the pin and the bond portion in each set are connected to each other with the bonding wire 20.

A virtual line 22 of FIG. 1 indicates a filling range of the after-mentioned molding resin, a part on a right side relative to the virtual line 22 is sealed in the molding resin, and a part on a left side relative to the virtual line 22 extends outside the molding resin. The bonding wires 20 and the bond portions 18E are sealed in the molding resin. Virtual lines 24 indicate lines to be cut after the molding resin is formed, and when cutting is performed, the pins adjacent to each other are insulated from each other. The pin 18F extends to the bond portion 18E in the molding resin, and is connected to a gate electrode, a sensor, or the like in the semiconductor element 16 via the bonding wire 20.

Figure 2A:
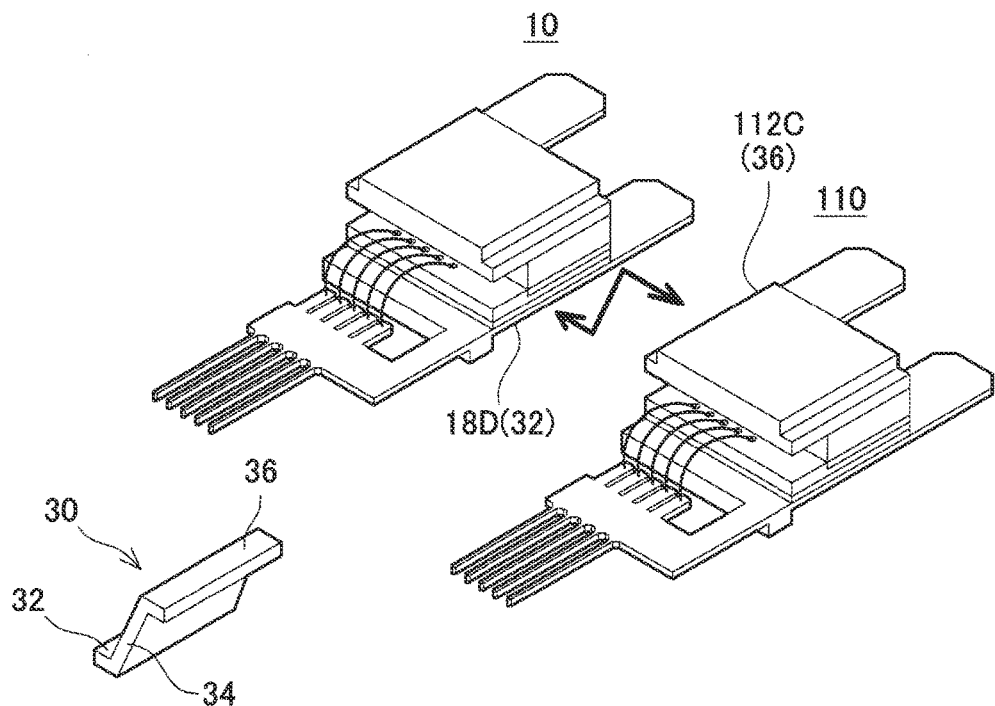
FIG. 2A illustrates a state where serial connection is provided by using connection components properly.
Figure 2B:
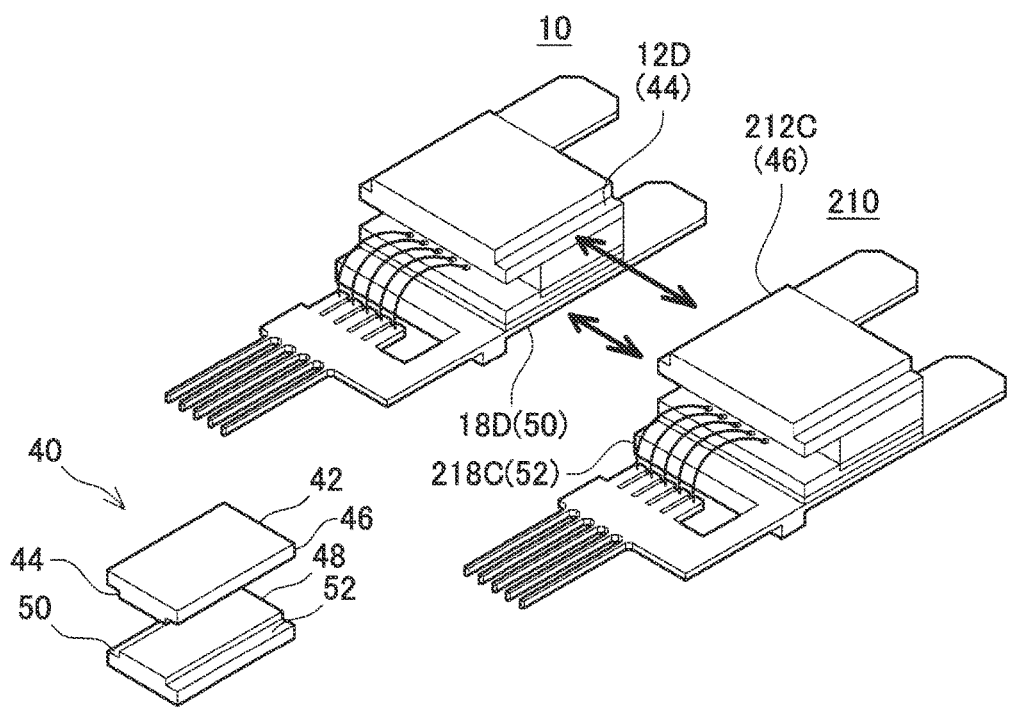
FIG. 2B illustrates a state where parallel connection is provided by using connection components properly.

A reference numeral 30 illustrated in FIGS. 2A, 2B and the like indicates a first connection component, which is made of a conductive member (metal in the embodiment) and is configured such that the flat portion 32 and the flat portion 36 are connected via a connecting portion 34. The flat portion 32 has a shape to be received by the stepped portion 18D of the back-surface electrode plate 18. When the flat portion 32 is fitted to the stepped portion 18D, a back surface of the flat portion 18A is flush with a back surface of the flat portion 32. The flat portion 36 has a shape to be received by the stepped portion 12C of the front-surface electrode plate 12. When the flat portion 36 is fitted to the stepped portion 12C, a front surface of the flat portion 12A is flush with a front surface of the flat portion 36.

A reference numeral 40 indicates a second connection component, and is constituted by a front-side second connection component 42 and a back-side second connection component 48. The front-side second connection component 42 is constituted by a pair of flat portions 44, 46 and a connecting portion that connects them. The flat portion 44 has a shape to be received by the stepped portion 12D of the front-surface electrode plate 12. When the flat portion 44 is fitted to the stepped portion 12D, the front surface of the flat portion 12A is flush with a front surface of the flat portion 44. The flat portion 46 has a shape to be received by the stepped portion 12C of the front-surface electrode plate 12. When the flat portion 46 is fitted to the stepped portion 12C, the front surface of the flat portion 12A is flush with a front surface of the flat portion 46. The back-side second connection component 48 is constituted by a pair of flat portions 50, 52 and a connecting portion that connects them. The flat portion 50 has a shape to be received by the stepped portion 18D of the back-surface electrode plate 18. When the flat portion 50 is fitted to the stepped portion 18D, the back surface of the flat portion 18A is flush with a back surface of the flat portion 50. The flat portion 52 has a shape to be received by the c stepped portion 18C of the back-surface electrode plate 18. When the flat portion 52 is fitted to the stepped portion 18C, the back surface of the flat portion 18A is flush with a back surface of the flat portion 52. The front-side second connection component 42 and the back-side second connection component 48 may be integrated with each other by an insulating material.

FIG. 2A illustrates a case where two semiconductor modules 10, 110 are connected in series by the first connection component 30. The flat portion 32 is fitted to the stepped portion 18D of the module 10 on the left side out of the two semiconductor modules 10, 110 placed adjacent to each other, and then connected thereto with solder, and further, the flat portion 36 is fitted to a stepped portion 112C of the module 110 on the right side, and then connected thereto with solder. Hereby, the semiconductor modules 10, 110 are connected in series to each other. Note that, in order to distinguish the modules on the left side and the right side from each other, a reference numeral of the left semiconductor module is assumed 10, and a reference numeral of the right semiconductor module is assumed 110. However, the semiconductor modules are the same and compatible with each other. Further, in the following description, in terms of a member in the semiconductor module 110, a number obtained by adding 100 to its corresponding member number in the semiconductor module 10 is used, so that a redundant description thereof is omitted.

FIG. 2B illustrates a case where two semiconductor modules 10, 210 are connected in parallel by the second connection component 40. The flat portion 44 is fitted to the stepped portion 12D of the module 10 on the left side out of the two semiconductor modules 10, 210 placed adjacent to each other, and then connected thereto with solder, and the flat portion 46 is fitted to a stepped portion 212C of the module 210 on the right side and then connected thereto with solder. Further, the flat portion 50 is fitted to the stepped portion 18D of the module 10 on the left side and connected thereto with solder, and the flat portion 52 is fitted to a stepped portion 218C of the module 210 on the right side and connected thereto with solder. Hereby, the semiconductor modules 10, 210 are connected in parallel to each other. Here, in order to distinguish the modules on the left side and the right side, a reference numeral of the left semiconductor module is assumed 10, and a reference numeral of the right semiconductor module is assumed 210. However, the semiconductor modules are the same and compatible with each other. Further, in terms of a member in the semiconductor module 210, a number obtained by adding 200 to its corresponding member number in the semiconductor module 10 is used, so that a redundant description thereof is omitted.

Figure 3:
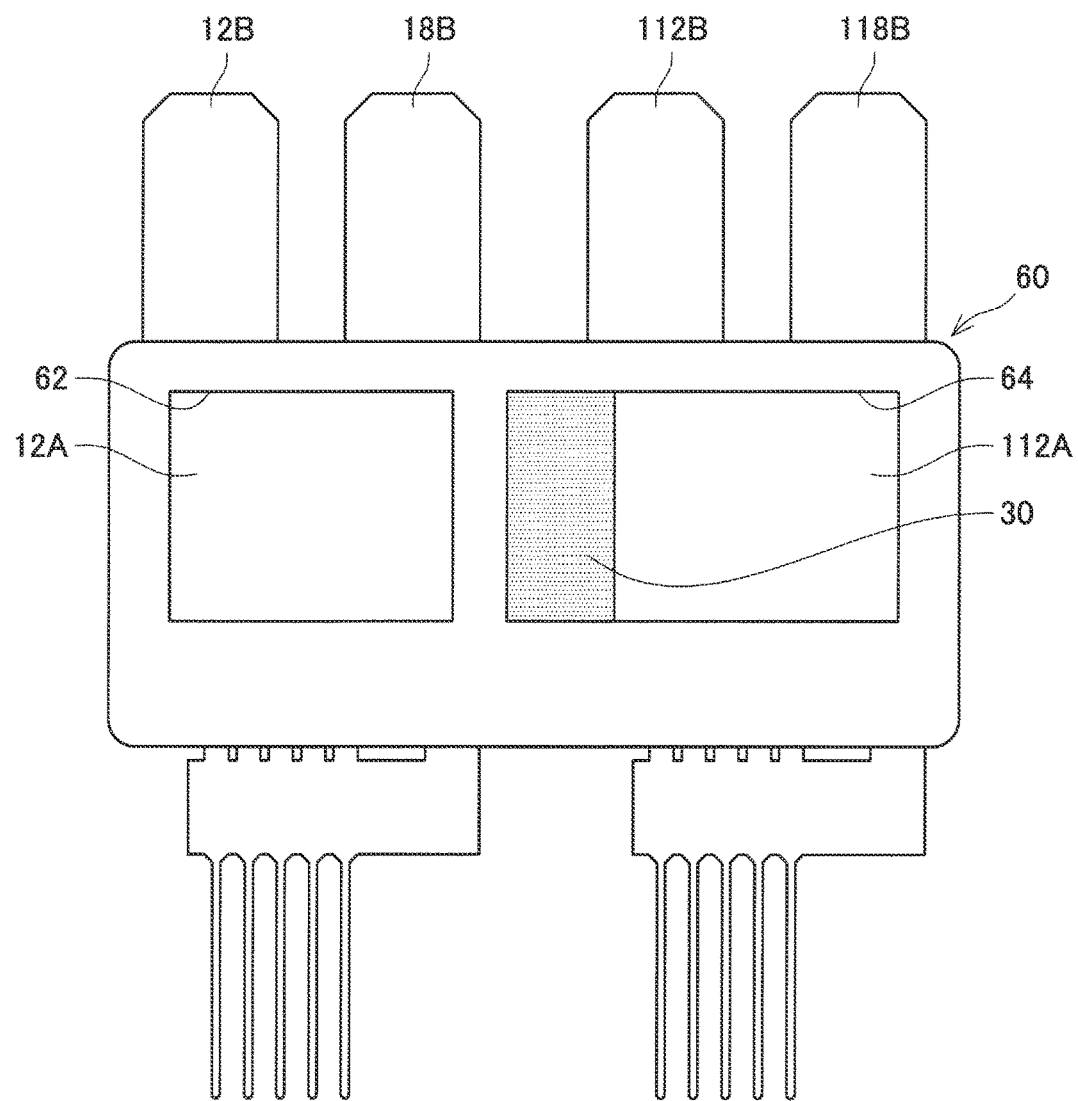
FIG. 3 is a plan view of a semiconductor device of serial connection.

FIG. 3 is a plan view of the semiconductor device in a state where the assembly illustrated in FIG. 2A is set in an injection molding die and molding is performed. A reference numeral 60 indicates a molding resin. The terminal portions 12B, 18B of the semiconductor module 10 on the left side and terminal portions 112B, 118B of the semiconductor module 110 on the right side extend outside the molding resin 60. The pins 18F, 118F also extend outside the molding resin 60. When cutting is performed along the cutting lines 24 in FIG. 1 in this state, the pins are insulated from each other. Reference numerals 62, 64 indicate openings formed in the molding resin 60, and front surfaces of the flat portions 12A, 112A and the connection component 30 are exposed in the openings. Although not illustrated in the figure, back surfaces of the flat portions 18A, 118A and the connection component 30 are also exposed on a back surface of the molding resin 60.

Figure 4:
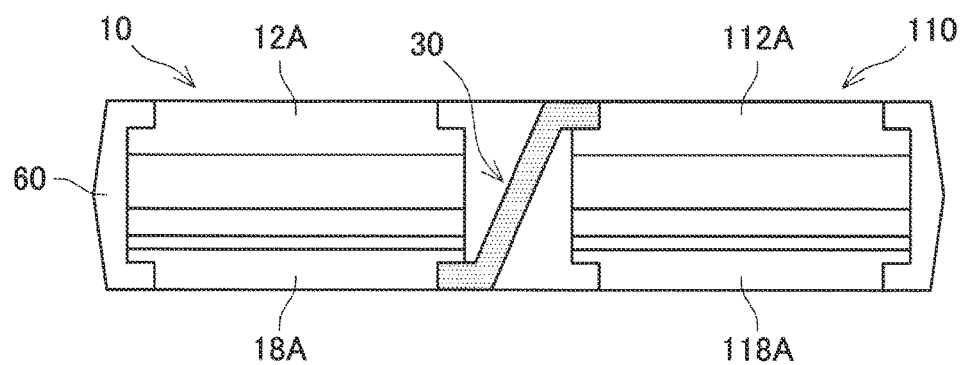
FIG. 4 is a sectional view of the semiconductor device in FIG. 3.
Figure 5:
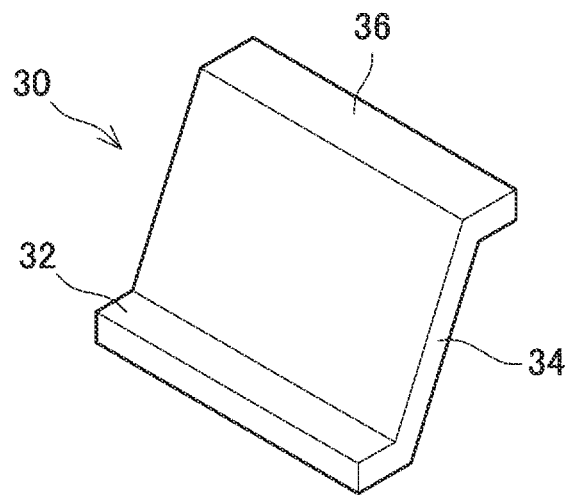
FIG. 5 is a perspective view of a first connection component.
Figure 6:
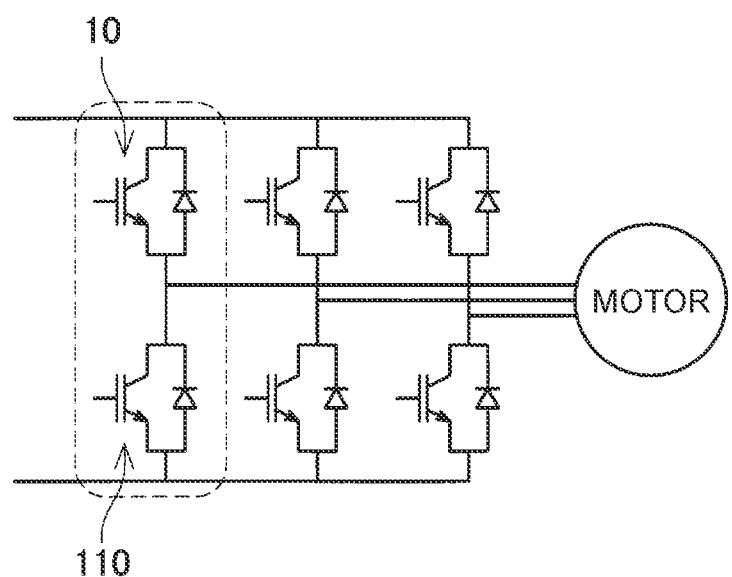
FIG. 6 illustrates a circuit provided by the semiconductor device in FIG. 3.

FIG. 4 is a sectional view of the semiconductor device in FIG. 3, and FIG. 5 is a perspective view of the first connection component 30. A part inside a broken line in FIG. 6 indicates a circuit provided in the semiconductor device in FIG. 3. When three semiconductor devices in FIG. 3 are connected in parallel, a three-phase inverter circuit is obtained. The semiconductor device in FIG. 3 is used such that the terminal portion 12B (connected to an emitter) of the semiconductor module 10 is connected to a negative electrode of a direct-current power source, the terminal portion 118B (connected to a collector) of the semiconductor module 110 is connected to a positive electrode of the direct-current power source, and the terminal portion 18B of the semiconductor module 10 and the terminal portion 112B of the semiconductor module 110 (both have the same potential and are connected by the first connection component 30) are connected to a motor. Note that the sectional view of FIG. 4 is schematic, and the members 12, 14, 16, 18, 20, 30 are sealed with the molding resin.

Figure 7:
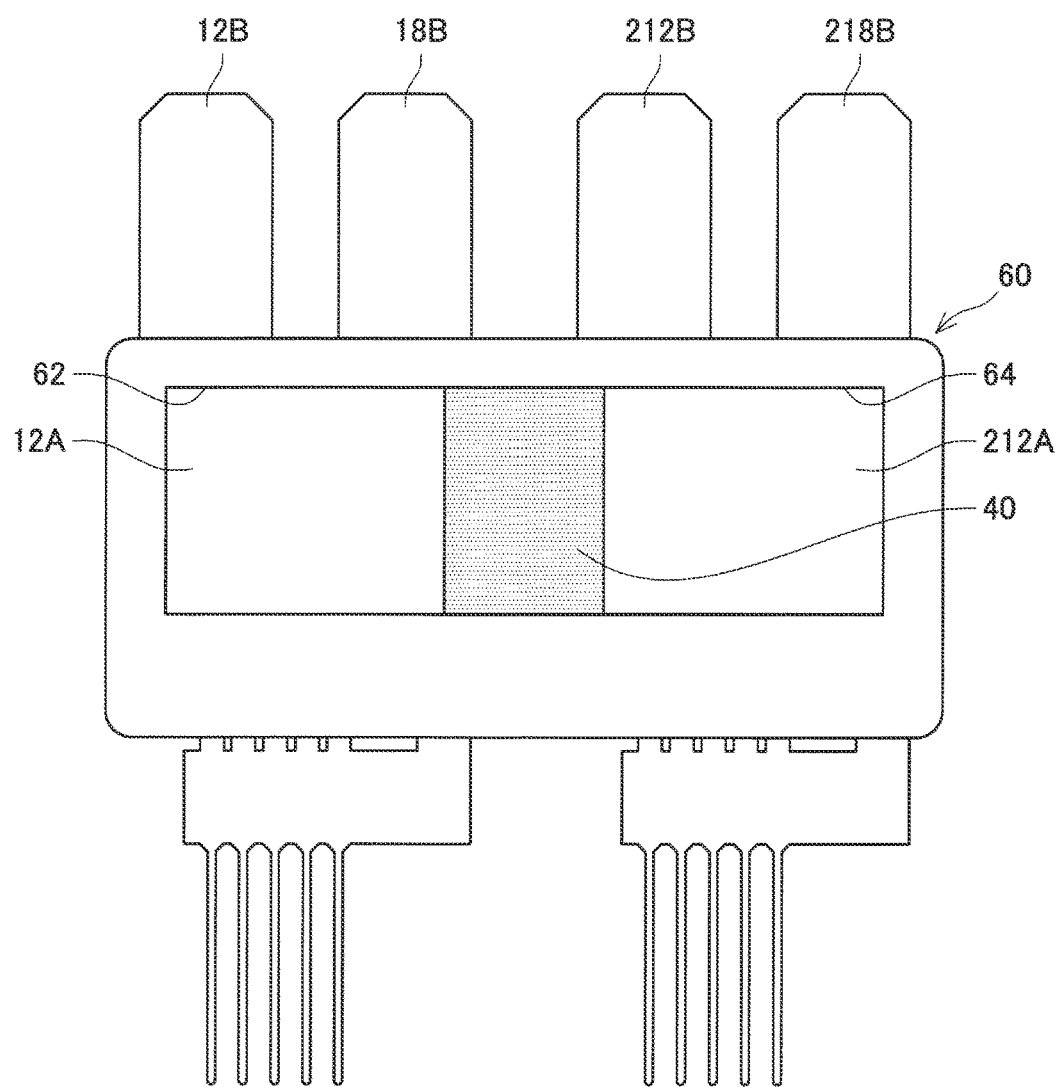
FIG. 7 is a plan view of a semiconductor device of parallel connection.

FIG. 7 is a plan view of the semiconductor device in a state where the assembly illustrated in FIG. 2B is set in an injection molding die and molding is performed. A reference numeral 60 indicates a molding resin. The terminal portions 12B, 18B of the semiconductor module 10 on the left side and terminal portions 212B, 218B of the semiconductor module 210 on the right side extend outside the molding resin 60. The pins 18F, 218F also extend outside the molding resin 60. When cutting is performed along the cutting lines 24 in FIG. 1 in this state, the pins are insulated from each other. Reference numerals 62, 64 indicate openings formed in the molding resin 60, and front surfaces of the flat portions 12A, 212A and the connection component 40 are exposed in the openings. Although not illustrated in the figure, back surfaces of the flat portions 18A, 218A and the connection component 40 are also exposed on a back surface of the molding resin 60.

Figure 8:
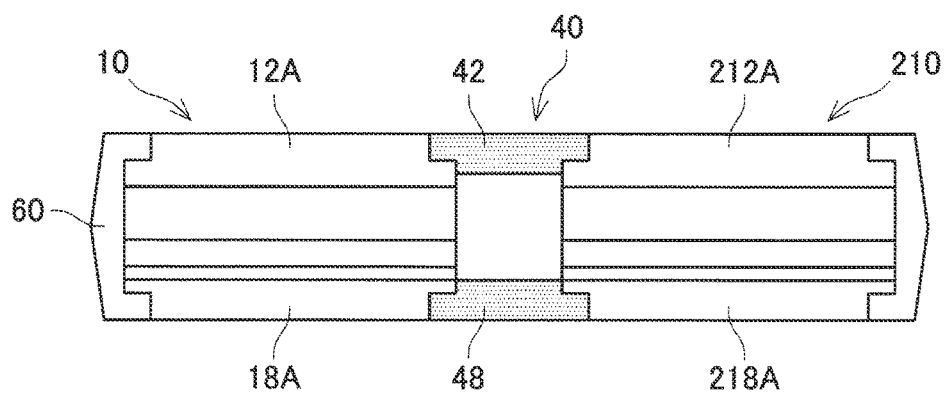
FIG. 8 is a sectional view of the semiconductor device in FIG. 7.
Figure 9:
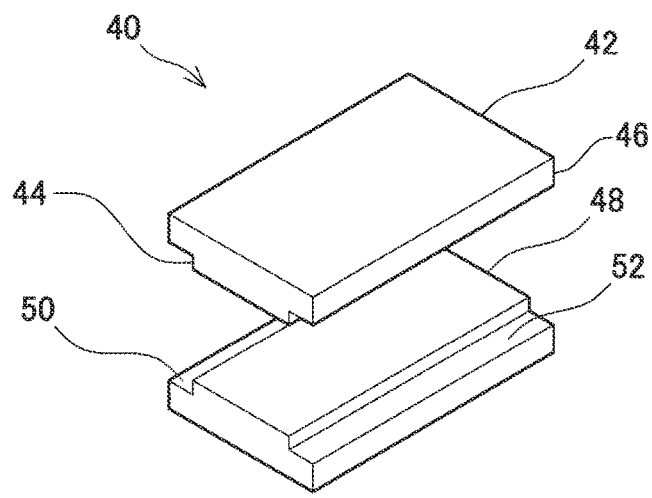
FIG. 9 is a perspective view of a second connection component.
Figure 10:
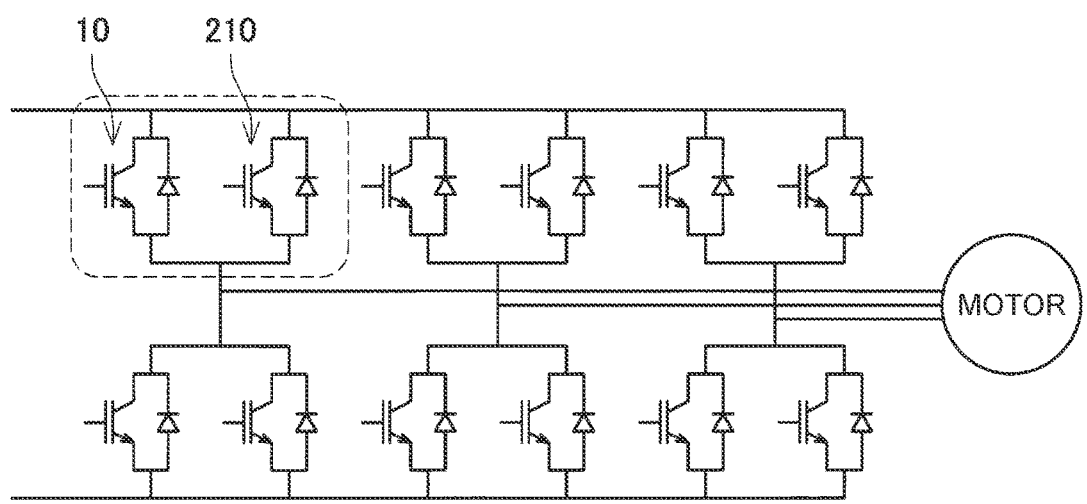
FIG. 10 illustrates a circuit provided by the semiconductor device in FIG. 7.

FIG. 8 is a sectional view of the semiconductor device in FIG. 7, and FIG. 9 is a perspective view of the second connection component 40. A part inside a broken line in FIG. 10 indicates a circuit provided in the semiconductor device in FIG. 7. For example, an inverter circuit for an electric vehicle deals with a heavy current, so it might be difficult to constitute one phase by one semiconductor element. It might be necessary to connect two semiconductor elements in parallel, so as to constitute one phase. The semiconductor device of FIG. 7 can deal with such a necessity. When two semiconductor devices in FIG. 7 are connected in series, one phase in the inverter circuit is obtained. For that purpose, two semiconductor devices in FIG. 7 are used such that they are connected in series. In a semiconductor device on an upper side (an upper arm), one or both of terminal portions 18B and 218B (both at the same potential) are connected to a positive electrode of a direct-current power source. In a semiconductor device on a lower side (a lower arm), one or both of terminal portions 12B and 212B (both at the same potential) are connected to a negative electrode of the direct-current power source. The terminal portions 12B and 212B (both at the same potential) of the semiconductor device on the upper side and the terminal portions 18B and 218B (both at the same potential) of the semiconductor device on the lower side are used by being connected to a motor. Note that the sectional view of FIG. 8 is schematic, and the members 12, 14, 16, 18, 20, 40 are sealed with the molding resin. The molding resin is also filled into a space between the front-side second connection component 42 and the back-side second connection component 48.

Figure 11:
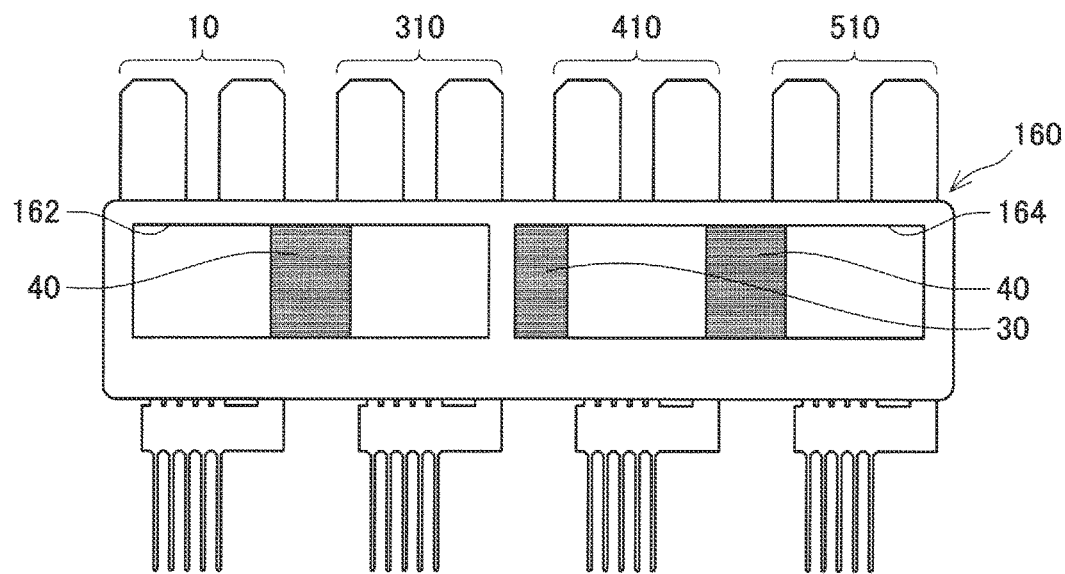
FIG. 11 is a plan view of a semiconductor device in which two circuits of parallel connection are connected in series.
Figure 12:
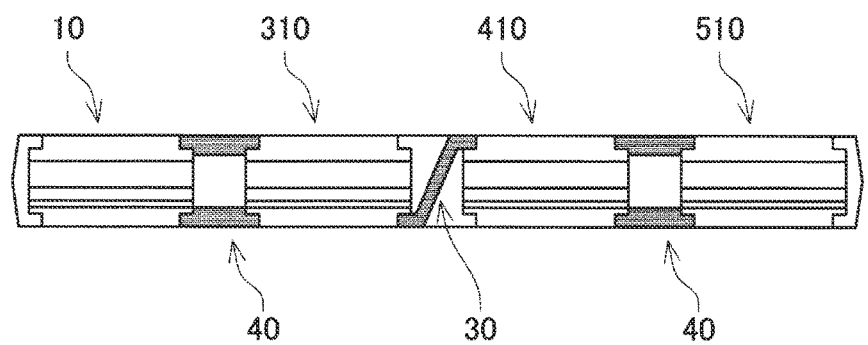
FIG. 12 is a sectional view of the semiconductor device in FIG. 11.
Figure 13:
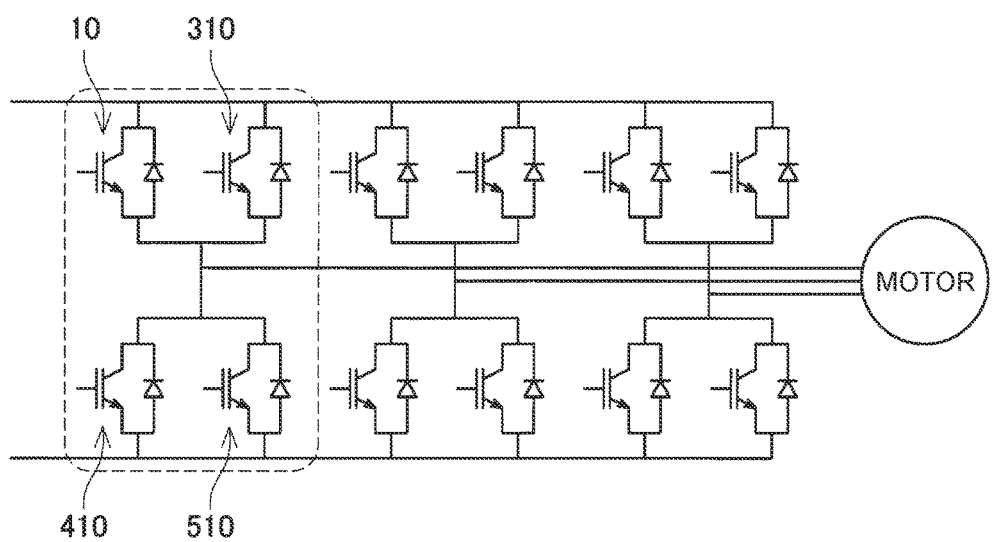
FIG. 13 illustrates a circuit provided by the semiconductor device in FIG. 11.

FIG. 11 illustrates a semiconductor device configured such that an assembly in which a first semiconductor module 10 and a second semiconductor module 310 are connected to each other by the second connection component 40 (corresponding to the assembly in FIG. 2B), the second semiconductor module 310 and a third semiconductor module 410 are connected to each other by the first connection component 30 (corresponding to the assembly of FIG. 2A), and the third semiconductor module 410 and a fourth semiconductor module 510 are connected to each other by the second connection component 40 (corresponding to the assembly of FIG. 2B) is integrated by a molding resin. A part inside a broken line in FIG. 13 indicates a circuit provided in the semiconductor device in FIG. 11. When three semiconductor devices in FIG. 11 are connected in parallel, a three-phase inverter circuit is obtained.

The above descriptions show merely a part of the embodiment, and various modifications can be made. For example, with the use of three semiconductor modules and two first connection components, it is possible to obtain a semiconductor device in which the three semiconductor devices are connected in series. With the use of three semiconductor modules and two second connection components, it is possible to obtain a semiconductor device in which the three semiconductor devices are connected in parallel.

The concrete examples of the disclosure have been described in detail, but these are merely examples and do not limit the disclosure according to Claims. A technique according to Claims includes embodiments obtained by variously modifying or altering the concrete examples exemplified as above. Technical elements described in the present specification or the drawings exhibit a technical usability solely or in various combinations, and are not limited to combinations as described in Claims as of filing the present application. Further, the technique exemplified in the present specification or the drawings can achieve a plurality of objects at the same time, and has a technical usability by achieving one of those objects.

What is claimed is:

1. A semiconductor device comprising:
   an assembly configured such that a plurality of semiconductor modules are connected by a connection component, the assembly being sealed with a molding resin, wherein:
   each of the plurality of semiconductor modules includes
      a semiconductor element including a front-surface electrode and a back-surface electrode,
      a front-surface electrode plate fixed to the front-surface electrode, and
      a back-surface electrode plate fixed to the back-surface electrode;
   the connection component is a separate component from the front-surface electrode plate and from the back-surface electrode plate;
   the connection component is either of a first connection component and a second connection component, the first connection component being configured to connect adjacent semiconductor modules to each other such that a front-surface electrode plate of one of the adjacent semiconductor modules is connected to a back-surface electrode plate of the other one of the adjacent semiconductor modules, the second connection component being configured to connect adjacent semiconductor modules to each other such that respective front-surface electrode plates are connected to each other and respective back-surface electrode plates are connected to each other; and
   the adjacent semiconductor modules are configured to be connected to each other by the first connection component or the second connection component,
   wherein the front-surface electrode plate includes a front-surface electrode plate stepped portion defined by a lower part of the front-surface electrode plate having a greater width than an upper part of the front-surface electrode plate, and the back-surface electrode plate includes a back-surface electrode plate stepped portion defined by an upper part of the back-surface electrode plate having a greater width than a lower part of the back-surface electrode plate, and
   wherein the first connection component or the second connection component includes:
      a first flat portion for connection with the front-surface electrode plate stepped portion or the back-surface electrode plate stepped portion of a first semiconductor module;
      a second flat portion for connection with the front-surface electrode plate stepped portion or the back-surface electrode plate stepped portion of a second semiconductor module adjacent the first semiconductor module; and
      a connecting portion connecting the first flat portion and the second flat portion.

2. A semiconductor device comprising:
a first semiconductor module including a first semiconductor element including a first front-surface electrode and a first back-surface electrode, a first front-surface electrode plate fixed to the first front-surface electrode, and a first back-surface electrode plate fixed to the first back-surface electrode;
a second semiconductor module including a second semiconductor element including a second front-surface electrode and a second back-surface electrode, a second front-surface electrode plate fixed to the second front-surface electrode, and a second back-surface electrode plate fixed to the second back-surface electrode;
a connection component configured to connect the first front-surface electrode plate to the second back-surface electrode plate, wherein the connection component is a separate component from the front-surface electrode plate and from the back-surface electrode plate; and
a molding resin configured to seal the first semiconductor module, the second semiconductor module, and the connection component,
wherein the first front-surface electrode plate includes a front-surface electrode plate stepped portion defined by a lower part of the first front-surface electrode plate having a greater width than an upper part of the first front-surface electrode plate, and the second back-surface electrode plate includes a back-surface electrode plate stepped portion defined by an upper part of the second back-surface electrode plate having a greater width than a lower part of the second back-surface electrode plate, and
wherein the connection component includes a first flat portion for connection with the front-surface electrode plate stepped portion, a second flat portion for connection with the back-surface electrode plate stepped portion, and a connecting portion connecting the first flat portion and the second flat portion.

3. The semiconductor device according to claim 2, wherein
the first front-surface electrode, the second back-surface electrode, and the connection component are partially exposed from the molding resin.

4. A semiconductor device comprising:
a first semiconductor module including a first semiconductor element including a first front-surface electrode and a first back-surface electrode, a first front-surface electrode plate fixed to the first front-surface electrode, and a first back-surface electrode plate fixed to the first back-surface electrode;
a second semiconductor module including a second semiconductor element including a second front-surface electrode and a second back-surface electrode, a second front-surface electrode plate fixed to the second front-surface electrode, and a second back-surface electrode plate fixed to the second back-surface electrode;
a first connection component configured to connect the first front-surface electrode plate to the second front-surface electrode plate, wherein the first connection component is a separate component from the first front-surface electrode plate and from the second front-surface electrode plate;
a second connection component configured to connect the first back-surface electrode plate to the second back-surface electrode plate, wherein the second connection component is a separate component from the first back-surface electrode plate and from the second back-surface electrode plate; and
a molding resin configured to seal the first semiconductor module, the second semiconductor module, the first connection component, and the second connection component,
wherein the front-surface electrode plate includes a front-surface electrode plate stepped portion defined by a lower part of the front-surface electrode plate having a greater width than an upper part of the front-surface electrode plate, and the back-surface electrode plate includes a back-surface electrode plate stepped portion defined by an upper part of the back-surface electrode plate having a greater width than a lower part of the back-surface electrode plate, and
wherein the first connection component and the second connection component includes:
a first flat portion for connection with the front-surface electrode plate stepped portion or the back-surface electrode plate stepped portion of a first semiconductor module;
a second flat portion for connection with the front-surface electrode plate stepped portion or the back-surface electrode plate stepped portion of a second semiconductor module adjacent the first semiconductor module; and
a connecting portion connecting the first flat portion and the second flat portion.

5. The semiconductor device according to claim 4, wherein
the first front-surface electrode, the second front-surface electrode, and the first connection component are partially exposed from the molding resin.

6. The semiconductor device according to claim 4, wherein
the first back-surface electrode, the second back-surface electrode, and the second connection component are partially exposed from the molding resin.

7. The semiconductor device according to claim 4, wherein
the first connection component and the second connection component are integrated with each other by an insulating material.

8. The semiconductor device according to claim 1, wherein
the first connection component includes the first flat portion for connection with the front-surface electrode plate stepped portion of the first semiconductor module, the second flat portion for connection with the back-surface electrode plate stepped portion of the second semiconductor module adjacent the first semiconductor module, and the connecting portion connecting the first flat portion and the second flat portion.

9. The semiconductor device according to claim 8, wherein
when the first flat portion is fitted with the front-surface electrode plate stepped portion, a front surface of the first flat portion and a front surface of the front-surface electrode plate are flush so as to form a substantially flat surface along a parallel plane, and
when the second flat portion is fitted with the back-surface electrode plate stepped portion, a back surface of the second flat portion and a back surface of the back-surface electrode plate are flush so as to form a substantially flat surface along a parallel plane.

10. The semiconductor device according to claim 1, wherein the second connection component includes a front-side connection component and a back-side connection component, wherein the front-side connection component includes the first flat portion for connection with the front-surface electrode plate stepped portion of the first semiconductor module, the second flat portion for connection with the front-surface electrode plate stepped portion of the second semiconductor module adjacent the first semiconductor module, and the connecting portion connecting the first flat portion and the second flat portion, and wherein the back-side connection component includes the first flat portion for connection with the back-surface electrode plate stepped portion of the first semiconductor module, the second flat portion for connection with the back-surface electrode plate stepped portion of the second semiconductor module adjacent the first semiconductor module, and the connecting portion connecting the first flat portion and the second flat portion.

11. The semiconductor device according to claim 10, wherein when the first flat portion and the second flat portion of the front-side connection component are fitted with the respective one of the front-surface electrode plate stepped portion of the first and second semiconductor modules, a front surface of the front-side connection component and a front surface of the front-surface electrode plates are flush so as to form a substantially flat surface along a parallel plane, and when the first flat portion and the second flat portion of the back-side connection component are fitted with the respective one of the back-surface electrode plate stepped portion of the first and second semiconductor modules, a back surface of the back-side connection component and a back surface of the back-surface electrode plates are flush so as to form a substantially flat surface along a parallel plane.

12. The semiconductor device according to claim 10, wherein the front-side connection component and the back-side connection component are integrated with each other by an insulating material.

13. The semiconductor device according to claim 1, wherein the second connection component includes a front-side connection component and a back-side connection component, the front-side connection component having two front-side connection component stepped portions, with one of the front-side connection component stepped portions on each side of the front-side connection component, with a first one of the front-side connection component stepped portions configured to be received by a corresponding front-surface electrode plate stepped portion of a first semiconductor module and with a second one of the front-side connection component stepped portions, on an opposite side from the first front-side connection component stepped portion, configured to be received by a corresponding front-surface electrode plate stepped portion of a second semiconductor module adjacent the first semiconductor module, and the back-side connection component having two back-side connection component stepped portions, with one of the back-side connection component stepped portions on each side of the back-side connection component, with a first one of the back-side connection component stepped portions configured to be received by a corresponding back-surface electrode plate stepped portion of the first semiconductor module and with a second one of the back-side connection component stepped portions, on an opposite side from the first back-side connection component stepped portion, configured to be received by a corresponding back-surface electrode plate stepped portion of the second semiconductor module adjacent the first semiconductor module.

14. The semiconductor device according to claim 13, wherein when the front-side connection component is fitted with the front-surface electrode plate stepped portion of the first and second semiconductor modules, a front surface of the front-side connection component and a front surface of the front-surface electrode plates are flush so as to form a substantially flat surface along a parallel plane, and when the back-side connection component is fitted with the back-surface electrode plate stepped portion of the first and second semiconductor modules, a back surface of the back-side connection component and a back surface of the back-surface electrode plates are flush so as to form a substantially flat surface along a parallel plane.

15. The semiconductor device according to claim 13, wherein the front-side connection component and the back-side connection component are integrated with each other by an insulating material.

16. The semiconductor device according to claim 2, wherein when the first flat portion is fitted with the front-surface electrode plate stepped portion, a front surface of the first flat portion and a front surface of the front-surface electrode plate are flush so as to form a substantially flat surface along a parallel plane, and when the second flat portion is fitted with the back-surface electrode plate stepped portion, a back surface of the second flat portion and a back surface of the back-surface electrode plate are flush so as to form a substantially flat surface along a parallel plane.

* * * * *